United States Patent
Yoon

(10) Patent No.: US 9,859,579 B2
(45) Date of Patent: Jan. 2, 2018

(54) APPARATUS AND METHOD FOR DIAGNOSING FAILURE OF AIR SUPPLY SYSTEM OF FUEL CELL SYSTEM

(71) Applicant: HYUNDAI MOTOR COMPANY, Seoul (KR)

(72) Inventor: Sung Gone Yoon, Suwon-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 83 days.

(21) Appl. No.: 14/936,733

(22) Filed: Nov. 10, 2015

(65) Prior Publication Data

US 2016/0336609 A1    Nov. 17, 2016

(30) Foreign Application Priority Data

May 14, 2015  (KR) .......................... 10-2015-0067022

(51) Int. Cl.
*G01F 1/00*       (2006.01)
*H01M 8/04664*    (2016.01)
(Continued)

(52) U.S. Cl.
CPC .......... *H01M 8/04686* (2013.01); *G01F 1/00* (2013.01); *G01R 31/3606* (2013.01); *G01R 31/3682* (2013.01); *H01M 8/04201* (2013.01); *H01M 8/04395* (2013.01); *H01M 8/04626* (2013.01); *H01M 8/04955* (2013.01); *H01M 8/0687* (2013.01); *H01M 2250/20* (2013.01); *Y02T 90/32* (2013.01)

(58) Field of Classification Search
None
See application file for complete search history.

(56) References Cited

U.S. PATENT DOCUMENTS 6,846,586 B2 *  1/2005  Aramaki ............. B60L 11/1881
                                                    429/410
7,887,965 B2 *  2/2011  Kobayashi ........ H01M 8/04007
                                                    429/413
(Continued)

FOREIGN PATENT DOCUMENTS

JP    2009-158155 A    7/2009
KR    10-2008-0053400 A    6/2008
(Continued)

*Primary Examiner* — Truc M Do
(74) *Attorney, Agent, or Firm* — McDermott Will & Emery LLP

(57) ABSTRACT

An apparatus and method for diagnosing failure of an air supply system of a fuel cell system are provided to accurately and promptly sense various fault states of an air supply system and provide such fault sensing information to a driver in advance to allow the driver to recognize the necessity of fixing the system, thus enhancing driving safety. The apparatus for diagnosing failure of an air supply system of a fuel cell system includes a flow rate sensor installed in an air supply line and configured to measure an air flow rate, a power sensor configured to measure power consumed for driving an air blower, and a controller electrically connected to the flow rate sensor and the power sensor and configured to determine whether the air supply system has a fault by using the air flow rate measured by the flow rate sensor and the power consumption measured by the power sensor.

12 Claims, 5 Drawing Sheets

(51) Int. Cl.
  *G01R 31/36*     (2006.01)
  *H01M 8/0438*    (2016.01)
  *H01M 8/04537*   (2016.01)
  *H01M 8/04955*   (2016.01)
  *H01M 8/0662*    (2016.01)
  *H01M 8/04082*   (2016.01)

(56) References Cited

U.S. PATENT DOCUMENTS

| | | | | |
|---|---|---|---|---|
| 2002/0094469 | A1* | 7/2002 | Yoshizumi | H01M 8/04089 429/411 |
| 2003/0022037 | A1* | 1/2003 | Parr | H01M 8/04223 429/429 |
| 2003/0203258 | A1* | 10/2003 | Yang | H01M 8/04029 429/414 |
| 2004/0166387 | A1* | 8/2004 | Imamura | H01M 8/04291 429/431 |
| 2004/0185316 | A1* | 9/2004 | Wells | H01M 8/04089 429/429 |
| 2005/0147863 | A1* | 7/2005 | Hiramatsu | H01M 8/04097 429/413 |
| 2005/0181246 | A1* | 8/2005 | Nakaji | B60L 11/1885 429/429 |
| 2006/0110640 | A1* | 5/2006 | Yoshida | H01M 8/04097 429/429 |
| 2006/0115700 | A1* | 6/2006 | Kotani | H01M 8/04238 429/444 |
| 2006/0286418 | A1* | 12/2006 | Saeki | H01M 8/04328 429/430 |
| 2007/0224471 | A1* | 9/2007 | Tanaka | H01M 8/04082 429/429 |
| 2007/0248857 | A1* | 10/2007 | Kurosawa | H01M 8/04029 429/413 |
| 2008/0217080 | A1* | 9/2008 | Maier | B60K 11/02 180/65.31 |
| 2008/0219866 | A1* | 9/2008 | Kwong | B60K 6/46 417/410.1 |
| 2009/0038867 | A1* | 2/2009 | Jufuku | B60L 3/0046 180/65.31 |
| 2009/0110981 | A1* | 4/2009 | Saito | H01M 8/04089 429/411 |
| 2009/0139686 | A1* | 6/2009 | Suzuki | B60K 6/445 165/42 |
| 2009/0317678 | A1* | 12/2009 | Bono | H01M 8/04007 429/436 |
| 2010/0098980 | A1* | 4/2010 | Ishikawa | H01M 8/04089 429/429 |
| 2010/0104905 | A1* | 4/2010 | Ishikawa | H01M 8/04089 429/445 |
| 2011/0212375 | A1* | 9/2011 | Taguchi | C01B 3/38 429/425 |
| 2013/0149623 | A1* | 6/2013 | Nakamura | H01M 8/04955 429/429 |
| 2013/0302708 | A1* | 11/2013 | Kamijo | H01M 8/04619 429/423 |
| 2014/0000860 | A1* | 1/2014 | Nishizawa | B60L 1/003 165/202 |
| 2014/0027089 | A1* | 1/2014 | Hisada | B60L 3/003 165/11.1 |
| 2014/0080022 | A1* | 3/2014 | Kim | H01M 8/04365 429/431 |
| 2014/0087279 | A1* | 3/2014 | Kiyohiro | H01M 8/04097 429/415 |
| 2014/0287334 | A1* | 9/2014 | Noh | H01M 8/2465 429/429 |
| 2014/0374081 | A1* | 12/2014 | Kakehashi | B60K 11/02 165/202 |
| 2015/0101789 | A1* | 4/2015 | Enomoto | B60H 1/00485 165/202 |
| 2015/0125771 | A1* | 5/2015 | Finnerty | B01J 12/007 429/423 |
| 2015/0140459 | A1* | 5/2015 | Miwa | H01M 8/0618 429/417 |

FOREIGN PATENT DOCUMENTS

| | | |
|---|---|---|
| KR | 10-2009-0058794 A | 6/2009 |
| KR | 20090058794 A * | 6/2009 |
| KR | 10-2011-0036448 A | 4/2011 |
| KR | 10-2013-0023431 A | 3/2013 |

* cited by examiner

APPARATUS AND METHOD FOR DIAGNOSING FAILURE OF AIR SUPPLY SYSTEM OF FUEL CELL SYSTEM

CROSS-REFERENCE TO RELATED APPLICATION

This application is based on and claims the benefit of priority to Korean Patent Application No. 10-2015-0067022, filed on May 14, 2015, in the Korean Intellectual Property Office, the disclosure of which is incorporated herein by reference in its entirety.

TECHNICAL FIELD

The present disclosure relates to an apparatus and method for diagnosing failure of an air supply system of a fuel cell system and, more particularly, to an apparatus and method for doing so, capable of accurately and promptly sensing various fault states of an air supply system and providing such fault sensing information to a driver in advance to allow the driver to recognize the necessity of fixing the system, thus enhancing driving safety.

BACKGROUND

Fuel cell systems are a sort of power generation system converting chemical energy of fuel directly into electric energy.

A fuel cell system includes a stack for generating electric energy, a fuel supply system for supplying fuel to the stack, an air supply system for supplying oxygen, an oxidizing agent required for an electrochemical reaction, in the air to the stack, and a heat and wafer management system for removing heat of reaction of the stack outwardly from the fuel cell system and controlling an operation temperature of the (fuel cell) stack.

The air supply system of the fuel cell system is configured to control the revolutions per minute (RPM) of an air blower through feedback controlling of currently required supply air with respect to a target flow rate by means of a flow rate sensor, and to adjust pressure of a cathode side by means of a pressure control valve.

However, when loss of supply air occurs due to blockage of a flow channel or leakage of a pipe in the air supply system, a normal output of the fuel cell system cannot be realized.

SUMMARY

The present disclosure has been made to solve the above-mentioned problems occurring in the prior art while advantages achieved by the prior art are maintained intact.

An aspect of the present disclosure provides an apparatus and method for diagnosing failure of an air supply system of a fuel cell system, capable of accurately and promptly sensing various fault states of an air supply system such as blockage of an air flow or loss of air supply due to leakage in a pipe or various components of the air supply system at an initial air supply stage when a vehicle equipped with a fuel cell is started, and providing such fault sensing information to a driver in advance to allow the driver to recognize the necessity of fixing the system, thus enhancing driving safety.

According to an exemplary embodiment in the present disclosure, an apparatus for diagnosing failure of an air supply system, which includes an air supply line supplying air to a cathode of a stack and an air filter and an air blower installed in the middle of the air supply line, of a fuel cell system includes: a flow rate sensor installed in the air supply line and configured to measure an air flow rate; a power sensor configured to measure power consumed for driving the air blower; and a controller electrically connected to the flow rate sensor and the power sensor and configured to determine whether the air supply system has a fault (or an error) by using the air flow rate measured by the flow rate sensor and power consumption measured by the power sensor.

An alarm unit may be connected to the controller, and when the controller determines that the air supply system has a fault, the fault state of the air supply system may be warned through the alarm unit.

In a state in which revolutions per minute (RPM) of the air blower are maintained uniformly for a preset diagnosis period of time, the controller may determine whether the air supply system has a fault.

According to another exemplary embodiment in the present disclosure, a method for diagnosing failure of an air supply system, which includes an air supply line supplying air to a cathode of a stack and an air filter and an air blower installed in the middle of the air supply line, of a fuel cell system includes: an measurement operation of measuring an air flow rate and power consumption respectively by a flow rate sensor and a power sensor when the air blower is in a predetermined revolution per minute (RPM) state after the fuel cell system is started; a determination operation of determining whether the measured air flow and the measured power consumption are within a normal range predetermined area; and an operation stop operation of warning about a fault state of the air supply system and subsequently stopping the operation of the fuel cell system, when it is determined that at least one of the air flow rate and the power consumption measured in the determination operation is not within a normal range predetermined area.

The measurement operation and the determination operation may be performed in a state in which the RPM of the air blower is uniformly maintained for a preset period of failure diagnosis time after the fuel cell system is started.

The method may further include: a calculation operation of calculating an air flow rate difference value as a difference value between an estimated air flow rate value and an measurement air flow rate value in the normal operation state of the fuel cell system, and a power consumption difference value as a difference value between an estimated power consumption value and an measurement power consumption value in the normal operation state of the fuel cell system, between the measurement operation and the determination operation. In the determination operation, it may be determined whether the air flow rate difference value and the power consumption difference value are within a normal range predetermined area.

When it is determined that at least one of the air flow rate difference values and the power consumption different values deviates from the normal range predetermined area, it may be determined whether the deviated state has lasted for a at least a predetermined period of time. If so, a fault state may be produced and the operation of the fuel cell system may be subsequently stopped.

The estimated air flow rate value may be extracted from an air flow rate estimation map representing an estimated air flow rate value corresponding to the RPM of the air blower in the normal operation state of the fuel cell system. The estimated power consumption value may be extracted from a power consumption estimation map representing an estimated power consumption value corresponding to the RPM of the air blower in the normal operation state of the fuel cell system.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
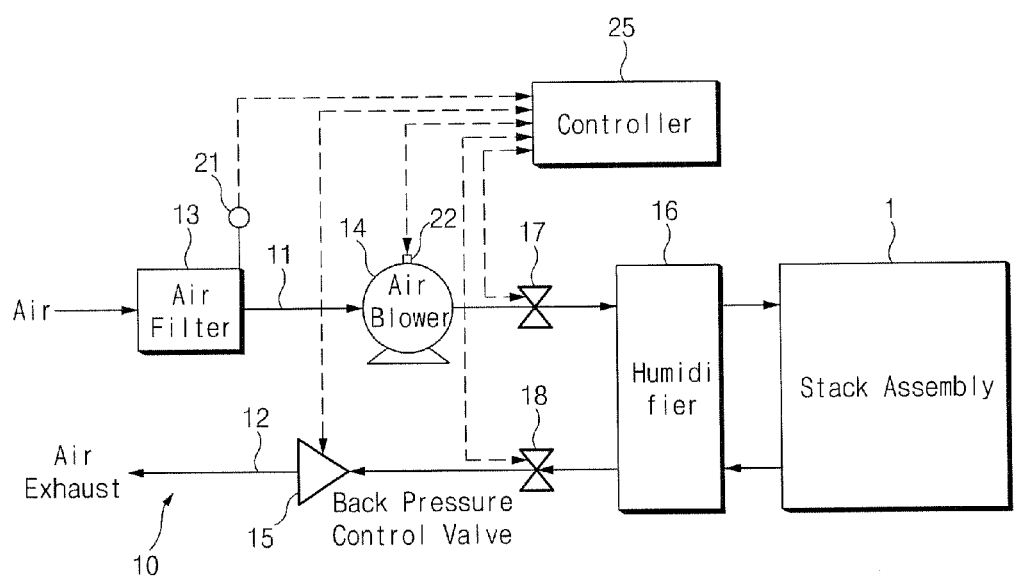
FIG. 1 is a schematic view of an apparatus for diagnosing failure of an air supply system of a fuel cell system according to an exemplary embodiment in the present disclosure.

Hereinafter, the exemplary embodiment of the present disclosure will be described in detail with reference to the accompanying drawings. For reference, dimensions of elements or thicknesses of lines illustrated in the drawings referred to describe the present disclosure may be exaggerated for the convenience of understanding. Also, the terms used henceforth have been defined in consideration of the functions in the present disclosure, and may be altered according to the intent of a user or operator, or conventional practice. Therefore, the terms should be defined on the basis of the entire content of this specification.

FIG. 1 shows an example of an air supply system 10 supplying air to a stack (or a stack assembly) 1.

Referring to FIG. 1, the air supply system 10 includes an air supply line 11 supplying air to a cathode of the stack 1, an air discharge line 12 discharging air from the cathode of the stack 1, an air filter 13 installed in the air supply line 11, an air blower 14 installed in a lower stream side of the air filter 13, a back pressure control valve 15 installed in the air discharge line 12, a humidifier 16 installed across the air supply line 11 and the air discharge line 12 at a lower stream of the air blower 14, a first shutoff valve 17 installed on the air supply line 11, and a second shutoff valve 18 installed on the air discharge line 12.

The apparatus for diagnosing failure of an air supply system of a fuel cell system according to an exemplary embodiment of in present disclosure includes a flow rate sensor 21 installed in the air supply line 11 and measuring an air flow rate, a power sensor 22 measuring power for driving the air blower 14, and a controller 25 electrically connected to the flow rate sensor 21 and the power sensor 22.

The flow rate sensor 21 may be installed in the air supply line 11 upstream from an upper stream side of the air blower 14, and the flow rate sensor 21 may also be installed to be adjacent to the air filter 13. The flow rate sensor 21 is configured to measure a flow rate of air supplied through the air supply line 11.

The power sensor 22 is formed of a hall sensor, or the like, installed in the air blower 14, and configured to measure power consumed when the air blower 14 is driven.

The controller 25 is configured to determine whether the air supply system has an error by using the air flow rate measured by the flow rate sensor 21 and the power consumption measured by the power sensor 22.

Figure 3:
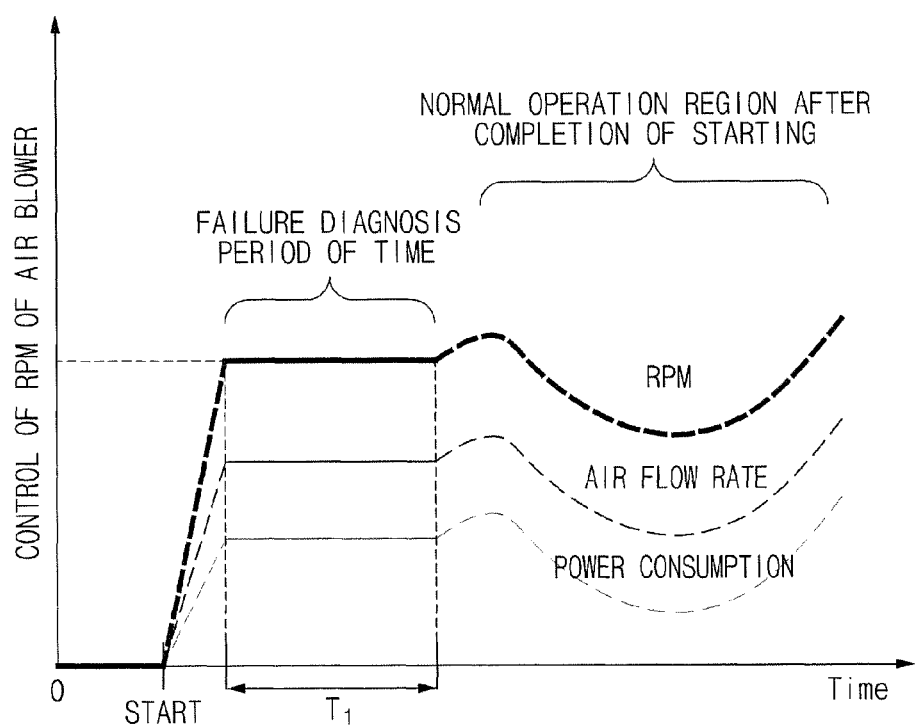
FIG. 3 is a graph showing behaviors of RPM, an air flow rate, and power consumption of an air blower appearing in a failure diagnosis carry-out region in which failure of the air supply system is diagnosed and in a normal operation region after starting of the fuel cell system is completed.

In particular, the controller 25 may be configured to determine whether the air supply system has an error in a state in which RPM of the air blower 14 is maintained uniformly during a preset diagnosis period of time T1 (during the period of time T1 in which RPM is maintained) as illustrated in FIG. 3.

In this manner, since whether the air supply system has an error is determined in a state in which RPM of the air blower 14 is maintained uniformly during the preset diagnosis period of time T1, behaviors of power consumption and air flow rate corresponding to the RPMs may be uniformly maintained, and thus, accuracy in the diagnosing failure of the air supply system may be enhanced.

An alarm unit (not shown) may be connected to the controller 25, and the controller 25 may be configured to warn of an abnormal state of the air supply system through the alarm unit when at least one of the measured air flow rate and the measured power consumption deviates from a normal range predetermined area(i.e., is not within a normal range predetermined area).

Figure 2:
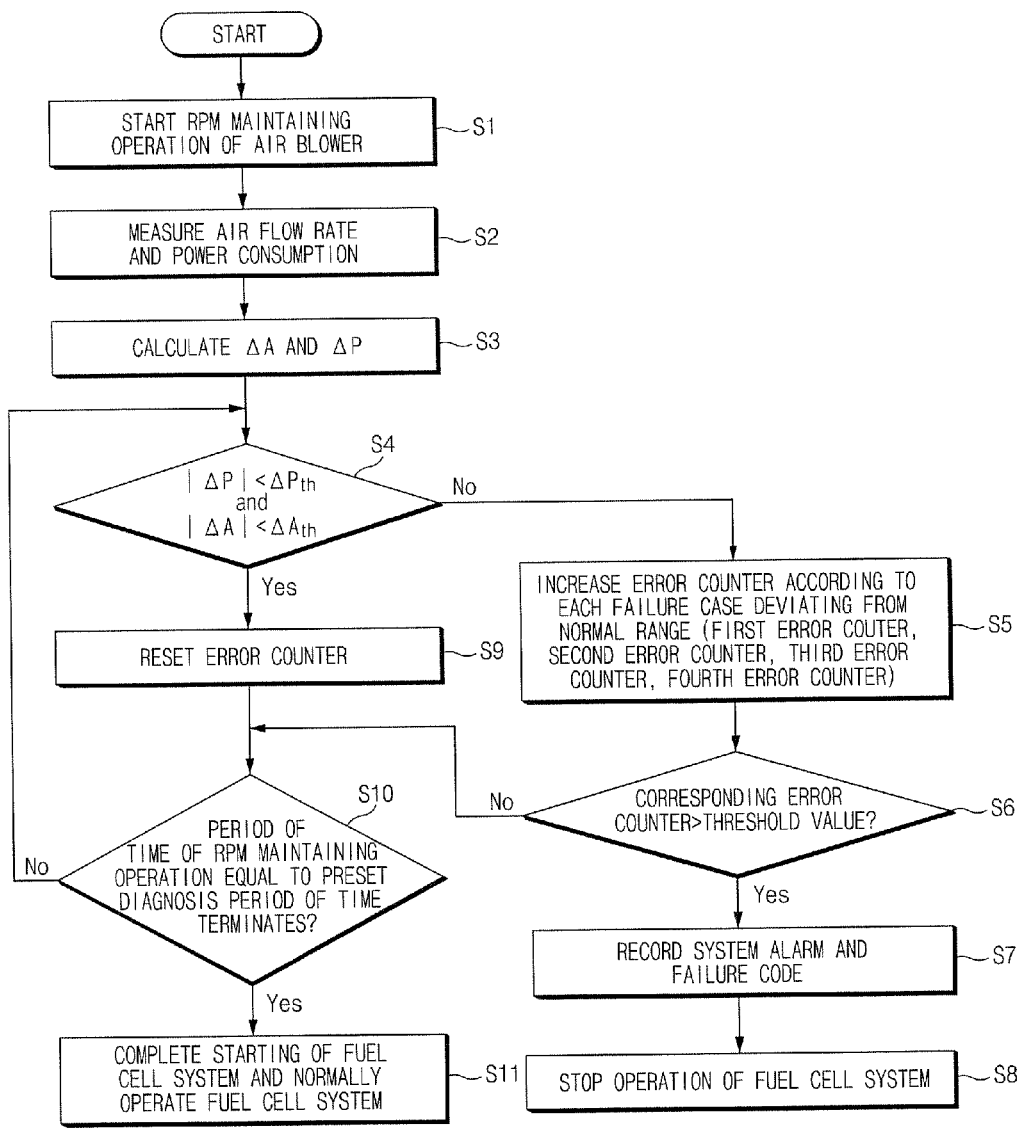
FIG. 2 is a flow chart describing a method for diagnosing failure of an air supply system of a fuel cell system according to an exemplary embodiment in the present disclosure.

FIG. 2 is a flow chart illustrating a method for diagnosing failure of an air supply system of a fuel cell system according to an exemplary embodiment in the present disclosure.

First, after the fuel cell system is started, an "RPM maintaining operation" for maintaining RPM of the air blower 14 for a preset failure diagnosis period of time T1 is started in operation S1. Such an "RPM maintaining operation" refers to an operation of uniformly maintaining the air blower 14 at a specific RPM during the preset failure diagnosis period of time T1 as illustrated in FIG. 3.

That is, by uniformly maintaining the air blower 14 at the specific RPM during the preset failure diagnosis period of time T1, behaviors of power consumption and air flow rate corresponding to the specific RPM of the air blower 14 may be uniformly maintained, and thus, accuracy in the failure diagnosis of the air supply system may be enhanced.

Also, a flow rate of air supplied to the cathode of the stack 1 through the air blower 14 is measured by the flow rate sensor 21, and power consumed for driving the air blower 14 is measured by the power sensor 22 in operation S2. Whether the air supply system 10 has an error is determined using the measurement air flow rate value and the measurement power consumption value.

When the fuel cell system is in a normally operated state, power consumption and an air flow rate of the air blower 14 may be estimated, and such estimated power consumption value and estimated air flow rate value may be utilized, together with the measurement power consumption value and the measurement air flow rate value mentioned above, for diagnosing failure of the air supply system.

Figure 4A:
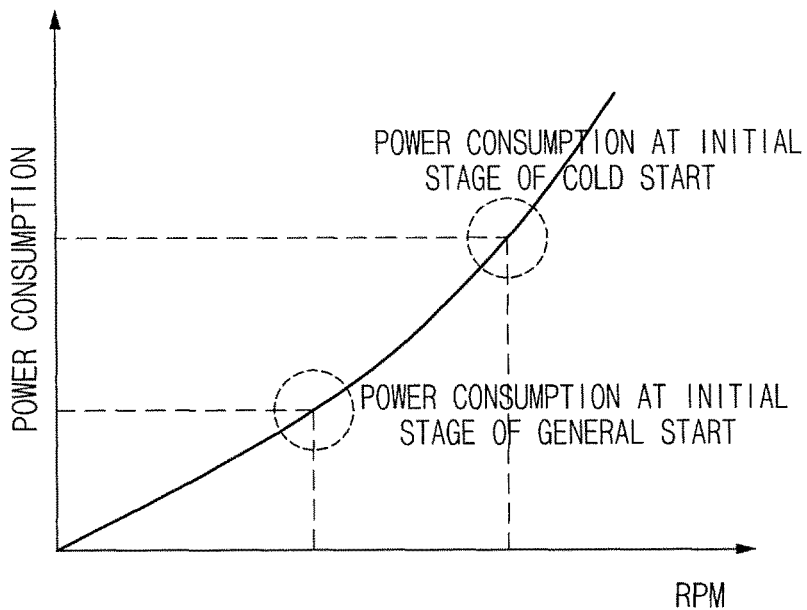
FIG. 4A is a graph showing a power consumption estimation map representing an estimated power consumption value of an air blower corresponding to RPM of the air blower in a state in which the fuel cell system is normally operated.
Figure 4B:
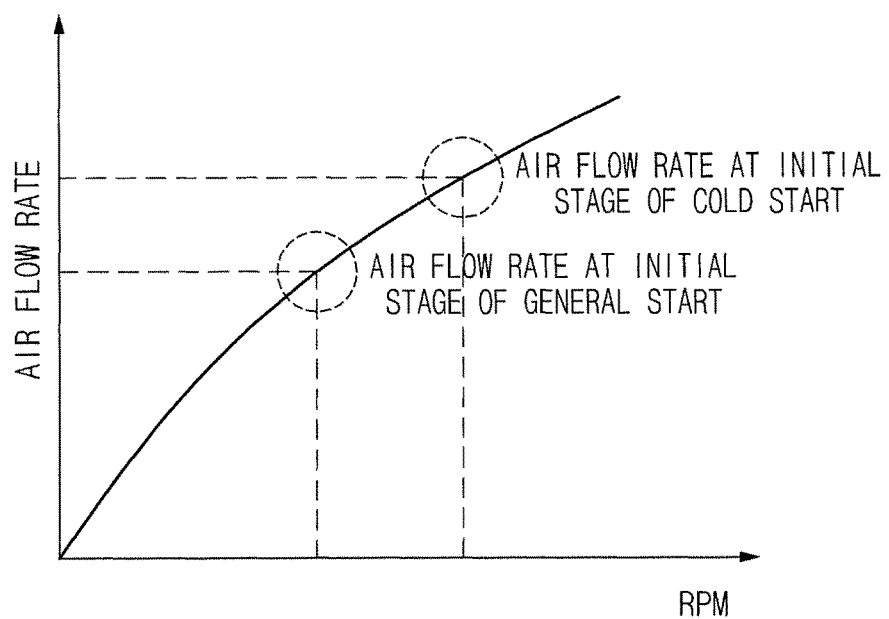
FIG. 4B is a graph showing an air flow rate estimation map representing an estimated air flow rate value corresponding to RPM of the air blower in a state in which the fuel cell system is normally operated.

FIG. 4A is a graph illustrating a power consumption estimation map representing an estimated power consumption value of the air blower corresponding to RPM of the air blower in a state in which the fuel cell system is normally operated, and FIG. 4B is a graph illustrating an air flow rate estimation map representing an estimated air flow rate value corresponding to RPM of the air blower in a state in which the fuel cell system is normally operated.

An estimated power consumption value corresponding to a specific RPM is extracted from the power consumption estimation map (see FIG. 4A), the estimated power consumption value is subtracted from the measurement power consumption value to obtain a difference value (that is, measurement power consumption value—estimated power consumption value=ΔP, hereinafter, ΔP will be referred to as a "power consumption difference value") in operation S3.

Also, an estimated air flow rate value corresponding to a specific RPM is extracted from the air flow rate estimation map (see FIG. 4B), and the estimated air flow rate value is subtracted from the measurement air flow rate value to obtain a difference value (that is, measurement air flow rate value−estimated air flow rate value=ΔA, hereinafter ΔA will be referred to as a "air flow rate difference value") in operation S3.

Figure 5:
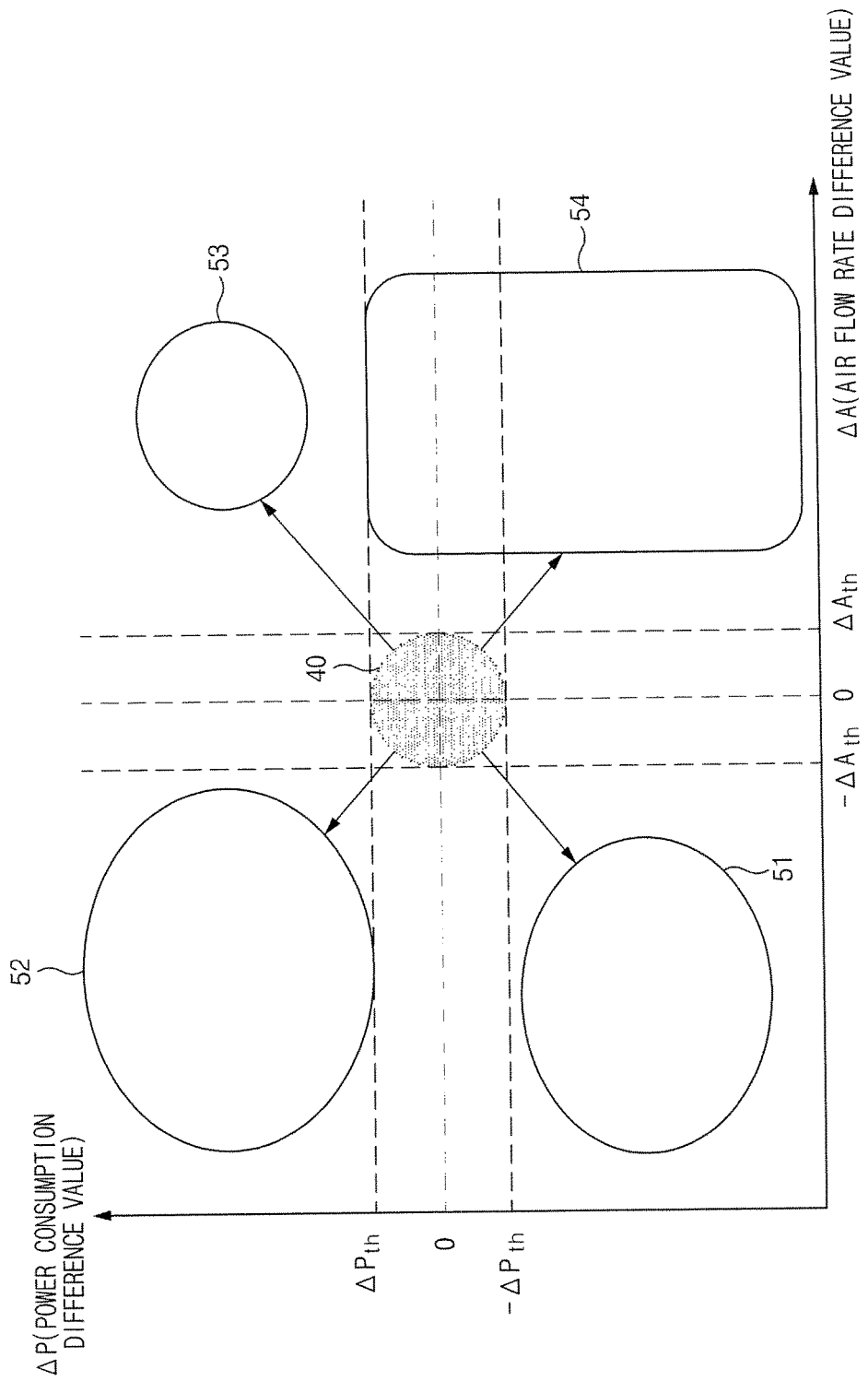
FIG. 5 is a graph showing correlation between a plurality of fault cases generated in the air supply system of a fuel cell system and a normal range predetermined area.

It is then determined whether the power consumption difference value ΔP and the air flow rate difference value ΔA are within a normal range predetermined area 40 in operation S4. That is, it is determined whether the power consumption difference value ΔP is within a limit value range of power consumption value ($|\Delta P| < \Delta P_{th}$), and it is also determined whether the air flow rate difference value ΔA is within a limit value range of an air flow rate ($|\Delta A| < \Delta A_{th}$) in operation S4. As illustrated in FIG. 5, the normal range 40 of the power consumption difference value ΔP is set by the limit value range ($-\Delta P_{th} \sim \Delta P_{th}$) of power consumption and the normal range 40 of the air flow rate difference value ΔA is set by limit values ($-\Delta A_{th} \sim \Delta A_{th}$) of an air flow rate a predetermined area for the power consumption difference value ΔP is an area from $-\Delta P_{th}$ to $\Delta P_{th}$ and a predetermined area for the air flow rate difference value ΔA is an area from $-\Delta A_{th}$ to $\Delta A_{th}$ the predetermined area 40 is an area where the predetermined area for the power consumption difference value ΔP and the predetermined area for the power consumption difference value ΔA overlap.

It is thus determined whether the power consumption difference value ΔP and the air flow rate difference value ΔA are within the normal range predetermined area 40 in operation S4.

In the determination operation S4, a plurality of failure cases 51, 52, 53, and 54 may be set, and various failure causes may be effectively transmitted through the plurality of failure cases 51, 52, 53, and 54.

Examples of the plurality of failure cases 51, 52, 53, and 54 are illustrated in FIG. 5.

A first failure case 51 is one in which an measurement power consumption value measured by the power sensor 22 is reduced as an measurement air flow rate value measured by the flow rate sensor 21 is reduced. As illustrated in FIG. 5, in the first failure case 51, the air flow rate difference value and the power consumption difference value are reduced relative to the normal range predetermined area 40, and thus, a region of the first failure case 51 is positioned in the left lower portion in the graph of FIG. 5.

The first failure case 51 is mainly caused as the air supply line 11 or other components, or the air discharge line 12 are clogged, and in this case, a flow rate of air introduced to the air blower 14 is reduced, and power consumption of the air blower 14 is reduced according to the reduction in the air flow rate.

The second failure case 52 is one in which an measurement air flow rate value measured by the flow rate sensor 21 is reduced while an measurement power consumption value measured by the power sensor 22 is increased. As illustrated in FIG. 5, in the second failure case 52, an air flow rate difference value is reduced relative to the normal range predetermined area 40, while a power consumption difference value is increased relative to the normal range predetermined area 40, and thus, a region of the second failure case 52 is positioned in the left upper portion in the graph of FIG. 5.

The second failure case 52 is caused as leakage occurs in the upper stream side of the air supply line 11 upstream from the air blower 14, and although the measurement air flow rate value detected by the flow rate sensor 21 appears to be reduced, but in actuality, since separate air is introduced to the air blower 14 through the leaked portion in addition to a normal supply path of the air supply line 11, an air flow rate to be processed by the air blower 14 is increased. Thus an measurement power consumption value measured by the power sensor 22 is increased. As illustrated in FIG. 5, in the second failure case 52, an air flow rate difference value appears to be reduced relative to the normal range predetermined area 40, but the power consumption difference value appears to be increased relative to the normal range predetermined area 40.

The third failure case 53 is a case in which both an measurement air flow rate value measured by the flow rate sensor 21 and an measurement power consumption value measured by the power sensor 22 are increased. As illustrated in FIG. 5, in the third failure case 53, an air flow rate difference value and a power consumption difference value are increased relative to the normal range predetermined area 40, and thus, a region of the third failure case 53 is positioned in the right upper portion in the graph of FIG. 5.

The third failure case 53 is caused due to leakage generated in the air supply line 11 or a component positioned in the air supply line 11 lower downstream from side of the air blower 14 or leakage generated in the air discharge line 12. Thus, since pressure at an exit side of the air blower 14 is reduced, a larger amount of air is discharged by the air blower 14Accordingly, a flow rate of air introduced to the air blower 14 is increased to increase an measurement air flow rate value measured by the flow rate sensor 21, and also, due to the increase in the air flow rate, an measurement power consumption value measured by the power sensor 22 is also increased. Therefore, as illustrated in FIG. 5, an air flow rate difference value and a power consumption difference value appear to be increased relative to the normal range predetermined area 40, in the third failure case 53.

The fourth failure case 54 is caused due to an abnormal performance of the flow rate sensor 21 or abnormal performance of the power sensor 22. As illustrated in FIG. 5, an air flow rate difference value of the fourth failure case 54 is increased relative to the normal range predetermined area 40, and a power consumption difference value of the fourth failure case 54 is within the normal range predetermined area 40 or reduced relative to the normal range predetermined area 40, and thus, a region of the fourth failure case 54 is positioned in the right portion in the graph of FIG. 5.

In the foregoing determination operation S4, when both the power consumption difference value and the air flow rate difference value are within the normal range predetermined area 40, an error counter is reset in operation S9, and when the period of time of "RPM maintaining operation" equal to the preset diagnosis period of time T1 terminates in step S10, starting of the fuel cell system is completed, and thereafter, the fuel cell system is normally operated in step S11 as illustrated in FIG. 3. Here, when the period of time of "RPM maintaining operation" equal to the preset diagnosis period of time T1 does not terminate, the process is returned to operation S4.

When at least one of the power consumption different value and the air flow rate difference value is not within the normal range predetermined area 40, the error counter is increased by a predetermined time interval in each of the plurality of failure cases 51, 52, 53, and 54 deviating from the normal range predetermined area 40 in operation S5.

A first error counter is an error counter corresponding to the first failure case 51, a second error counter is an error counter corresponding to the second failure case 52, a third error counter is an error counter corresponding to the third failure case 53, and a fourth error counter is an error counter corresponding to the fourth failure case 54. Thus, the first error counter, the second error counter, the third error counter, and the fourth error counter each are increased by a predetermined time interval (for example 10 msec) in operation S5.

With the error counters each increased by a predetermined time interval, it is determined whether an error counter corresponding to any one failure case is greater than a predetermined threshold value in operation S6. Here, the threshold value refers to a reference value used for determining whether the corresponding failure case has lasted for a predetermined period of time as the corresponding error counter was increased by a predetermined time interval for a predetermined number of times.

For example, in a case in which the threshold value is 100, when the first error counter corresponding to the first failure case 51 is increased by 10 msec each time for a total of 11 times, the first error counter is 110, which is determined to be greater than the threshold value 100. Thus, since the state of the first failure case 51 was maintained for a period of time of 110 msec, greater than the threshold value 100 msec, it is determined that the first failure case 51 has occurred in the air supply system of the fuel cell system, currently.

Here, when the corresponding error counter is greater than the threshold value, it means that at least any one of the first to fourth failure cases 51, 52, 53, and 54 has occurred with respect to the air supply system of the fuel cell system. The controller 25 records a system alarm and a failure code to correspond to the failure case in operation S7.

After the system alarm and the failure code are recorded, the operation of the fuel cell system is stopped in operation S8.

Meanwhile, in a case in which each error counter is smaller than the threshold value, the process is returned to operation S10 and it is determined whether the RPM maintaining operation equal to the preset failure diagnosis period of time T1 has terminated. When the period of time of RPM maintaining operation equal to the preset failure diagnosis period of time T1 has not terminated, the process is returned to operation S4 and the aforementioned process is repeatedly performed.

As described above, according to the exemplary embodiments in the present disclosure, various fault states of an air supply system such as blockage of an air flow or loss of air supply due to leakage in a pipe or various components of the air supply system may be accurately and promptly sensed at an initial air supply stage when a vehicle equipped with a fuel cell is started, and such fault sensing information is provided to a driver in advance to allow the driver to recognize the necessity of fixing the system, thus enhancing driving safety.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. An apparatus for diagnosing failure of an air supply system, which includes an air supply line supplying air to a cathode of a stack and an air filter and an air blower installed in the middle of the air supply line, of a fuel cell system, the apparatus comprising:
   a flow rate sensor installed in the air supply line upstream from the air blower and adjacent to the air filter and configured to measure an air flow rate;
   a power sensor configured to measure power consumed for driving the air blower; and
   a controller electrically connected to the flow rate sensor and the power sensor and configured to determine whether the air supply system has a fault by using the air flow rate measured by the flow rate sensor and power consumption measured by the power sensor.

2. The apparatus according to claim 1, wherein an alarm unit is connected to the controller, and when the controller determines that the air supply system has a fault, the fault state of the air supply system is warned through the alarm unit.

3. The apparatus according to claim 1, wherein, in a state in which a revolution per minute (RPM) of the air blower is maintained as a specific RPM uniformly for a preset diagnosis period of time, the controller determines whether the air supply system has a fault.

4. A method for diagnosing failure of an air supply system, which includes an air supply line supplying air to a cathode of a stack and an air filter and an air blower installed in the middle of the air supply line, of a fuel cell system, the method comprising:
   a measurement operation of measuring an air flow rate by a flow rate sensor installed in the air supply line upstream from the air blower and adjacent to the air filter and measuring power consumption of the air blower by power sensor and power consumption respectively by a flow rate sensor and a power sensor when the air blower is in a predetermined revolution per minute (RPM) state after the fuel cell system is started;
   a determination operation of determining whether the measured air flow and the measured power consumption are within a normal range predetermined area; and
   an operation stop operation of warning about a fault state of the air supply system and subsequently stopping an operation of the fuel cell system, when it is determined that at least one of the air flow rate and the power consumption measured in the determination operation is not within the normal range predetermined area.

5. The method according to claim 4, wherein the measurement operation and the determination operation are performed in a state in which the RPM of the air blower is uniformly maintained for a preset period of diagnosis time after the fuel cell system is started.

6. The method according to claim 4, further comprising:
   a calculation operation of calculating an air flow rate difference value as a difference value between an estimated air flow rate value and a measurement air flow rate value in a normal operation state of the fuel cell system and a power consumption difference value as a difference value between an estimated power consumption value and a measurement power consumption value in the normal operation state of the fuel cell system, between the measurement operation and the determination operation, wherein, in the determination operation, it is determined whether the air flow rate difference value and the power consumption difference value are within a normal range predetermined area.

7. The method according to claim 6, wherein when it is determined that at least one of the air flow rate difference value and the power consumption difference value deviates from the normal range predetermined area, it is determined whether the deviated state has lasted for a predetermined period of time, and when the deviated state has lasted for a predetermined period of time, a fault state is warned and the operation of the fuel cell system is subsequently stopped.

8. The method according to claim 7, wherein the estimated air flow rate value is extracted from an air flow rate estimation map representing an estimated air flow rate value corresponding to the RPM of the air blower in the normal operation state of the fuel cell system, and the estimated power consumption value is extracted from a power consumption estimation map representing an estimated power consumption value corresponding to the RPM of the air blower in the normal operation state of the fuel cell system.

9. The method according to claim 6, wherein, in the determination operation, when the air supply line or an air discharge line is clogged, it is determined that the air flow rate difference value and the power consumption difference value each are reduced relative to the normal range predetermined area.

10. The method according to claim 6, wherein, in the determination operation, when leakage occurs in an upper stream side of the air supply line upstream from the air blower, it is determined that the air flow rate difference value is reduced relative to the normal range predetermined area and the power consumption difference value is increased relative to the normal range predetermined area.

11. The method according to claim 6, wherein, in the determination operation, when leakage occurs in the air supply line downstream from the air blower or an air discharge line positioned in a lower downstream side of from the air blower, it is determined that the air flow rate difference value and the power consumption difference value are increased relative to the normal range predetermined area.

12. The method according to claim 6, wherein, in the determination operation, when performance of the flow rate sensor or performance of the power sensor has an error, it is determined that the air flow rate difference value is increased relative to the normal range predetermined area and the power consumption difference value is within the normal range predetermined area or is reduced relative to the normal range predetermined area.

* * * * *